United States Patent [19]
Momoda et al.

[11] Patent Number: 5,989,372
[45] Date of Patent: Nov. 23, 1999

[54] SOL-GEL BONDING SOLUTION FOR ANODIC BONDING

[75] Inventors: Leslie A. Momoda, Los Angeles; Harold M. Olsen, West Covina, both of Calif.; Ruth E. Beni, Carmel; Larry L. Jordan, Kokomo, both of Ind.

[73] Assignees: Hughes Electronics Corporation, Segundo El, Calif.; Delco Electronics Corporation, Kokomo, Ind.

[21] Appl. No.: 09/074,063

[22] Filed: May 7, 1998

[51] Int. Cl.[6] .................................................... B32B 31/24
[52] U.S. Cl. .................................. 156/89.11; 156/89.12; 156/273.1; 156/275.7; 65/43; 438/466; 501/12; 501/66
[58] Field of Search .............................. 156/89.11, 89.12, 156/273.1, 273.9, 275.7, 274.4, 274.8; 65/43; 148/DIG. 12; 501/12, 66; 438/455, 466, 661, 782, 790

[56] References Cited

U.S. PATENT DOCUMENTS

| | | |
|---|---|---|
| 3,408,222 | 10/1968 | Navias et al. . |
| 3,417,459 | 12/1968 | Pomerantz et al. .................. 156/273.1 |
| 3,595,719 | 7/1971 | Pomerantz et al. .................. 156/273.1 |
| 3,799,754 | 3/1974 | Thomas et al. . |
| 3,847,583 | 11/1974 | Dislich et al. ............................ 501/66 |
| 5,091,330 | 2/1992 | Cambou et al. ................. 148/DIG. 12 |
| 5,160,560 | 11/1992 | Welkowsky et al. ................. 156/273.1 |
| 5,217,754 | 6/1993 | Santiago-Aviles et al. . |

OTHER PUBLICATIONS

K.B. Albaugh et. al., Mechanisms of Anodic Bonding of Silicon to Pyrex Glass, IEEE Solid State Sensor and Actuator Workshop, pp. 109–110 (1988).
C.J. Brinker et. al., Sol–Gel Science, Academic Press, pp. 849–851 (1990).
A.D. Brooks et. al., Low–Temperature Electrostatic Silicon–to–Silicon Seals Using Sputtered Borosilicate Glass, J. Electrochem. Soc. 119 (1972) 545–546.
R.H. Dalton, Solder Glass Sealing, J. Amer. Ceramic Soc., vol. 39, No. 3, pp. 109–112 (1956).
D.W.A. Forbes, Solder Glass Seals in Semi–Conductor Packaging, Glass Technology, vol. 8, No. 2, pp. 32–42 (1967).
R.R. Tummala et. al., Microelectronics Packaging Handbook, Van Nostrand Reinhold, pp. 748–752 (? Year).

*Primary Examiner*—Michael W. Ball
*Assistant Examiner*—Michael A Tolin
*Attorney, Agent, or Firm*—V. D. Duraiswamy; M. W. Sales

[57] ABSTRACT

A method of bonding two electrically conductive substrates together includes the steps of forming a dielectric layer between the substrates, with the layer being formed from a sol-gel solution. Through the application of a constant voltage an ionic depletion region is created in the dielectric layer. After the step of creating the ionic depletion region, the dielectric layer and substrates are heated such that an oxygen depletion region is created in one of the substrates. The sol-gel solution includes sodium aluminoborosilicate having about 75–90 mol % $SiO_2$, about 5–20 mol % $B_2O_3$, about 1–10 mol % $Na_2O$ and about 0–5 mol % $Al_2O_3$.

23 Claims, 1 Drawing Sheet

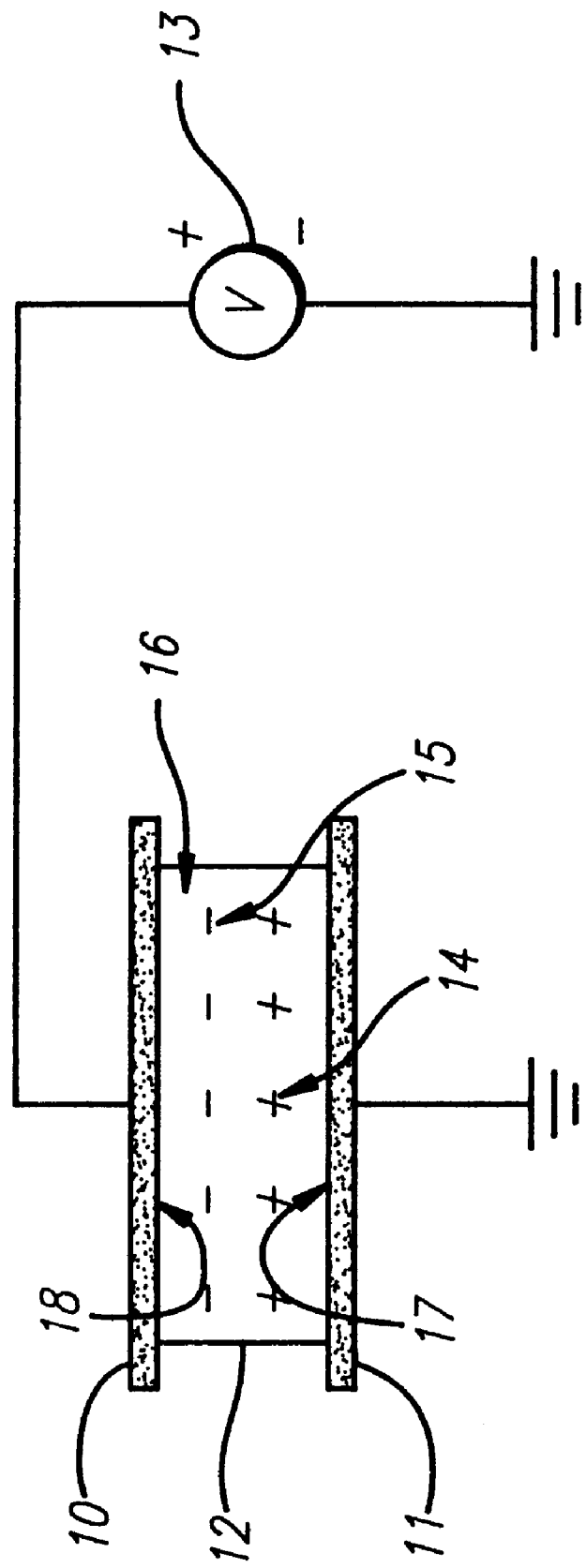

SOL-GEL BONDING SOLUTION FOR ANODIC BONDING

BACKGROUND OF THE INVENTION

1. Field of the Invention

The present invention relates to bonding methods and, more particularly, to an anodic bonding method using a sol-gel solution for the bonding of various substrates, such as metals, glass, ceramics, and semiconductor materials.

2. Description of Related Art

Screen printed frit bonding techniques have been used for bonding silicon-based devices that have been micromachined. That technique involves a thick film paste bonding medium which is distributed through a photo-processed stencil or mask by a screen printer onto a wafer surface. The mask is needed to accomplish a uniform layer of the paste and the process does not typically allow for a layer over the entire substrate surface. With less than the entire surface having a bonding layer, there is less than maximum potential device yield per wafer.

Another past method of bonding substrates utilizes a soldering process with a solder having a lower melting point than the substrates. For example, Dalton, "Solder Glass Sealing," Journal of the American Ceramic Society, Vol. 39, No. 3, pp. 109–112 (1956) describes the matching of lead, silicon, and boron oxide solders for bonding glass substrates together. Generally, when the solder is heated and melted, it adheres to the substrates. Thereafter, the solder is cooled and solidified to form a mechanical bond between the substrates. However, the strength of the bond is dependent upon how well the solder adheres to the substrates and the strength of the solder itself. The degree of adherence is dependent upon the degree of contraction of the substrate relative to the solder during the solidification of the solder. A greater relative difference in contraction will cause a greater weakening of the bond. Accordingly, the strength of the bond is dictated by how well one can match the contractions of the materials being employed.

Anodic or field assisted bonding has been employed to bond various substrates. That method has been desirable because of, among other things, the relatively low temperatures employed, which tend to minimize the potential of substrate damage. As an example, anodic bonding of silicon to Pyrex® glass is described by Albaugh et al., "Mechanisms of Anodic Boding of Silicon to Pyrex® Glass," IEEE Solid State Sensor and Actuator Workshop, pp. 109–110 (1988). Traditionally, an ionically conducting dielectric layer is established between an insulating substrate such as glass or ceramic and a conducting substrate such as metal. A constant voltage is then applied across the insulating substrate. Thereby, a contact area between the substrates increases due to electrostatic attraction between the substrates. Next, permanent bonding forces develop by virtue of an ionic depletion layer developed in the dielectric layer at the interface to the insulating substrate. An oxygen depletion layer develops in the conducting substrate at the interface to the dielectric layer. The permanent bonding is chemical in nature.

Despite the advantages of anodic bonding, a disadvantage has been the manner in which the dielectric layer has been provided. Prior methods have used sputtered or chemical vapor deposition layers. But those methods have been time consuming because of the need for masks and batch processing. An additional processing constraint is present due to the typical need for a vacuum environment in those methods. Other past anodic bonding methods have employed plates or shims for the dielectric layer. The plates and shims are commercially produced and have commonly been about 5 to 10 mils thick. Because of mechanical constraints on how thin a plate or shim can be machined, the applied voltage needed has also been constrained at a minimum amount. That is due to the fact that, for the same amount of bonding, as the thickness of the plate/shim increases, so does the need for higher applied voltages, and vice versa. And as the feature size in semiconductor devices decreases, the potential for device damage increases for the same applied voltage. With a Pyrex® glass shim, for example, which is about 10 mils thick, 20 to 30 V at 200 degrees C may be required to create an anodic bond to a conducting metal or semiconductor substrate. However, many semiconductors, such as a 0.5 $\mu$m complementary metal on silicon (CMOS), usually have a limit of about 5 to 10 V before damage occurs, thus making the use of a typical Pyrex® glass shim impractical for prior anodic bonding techniques.

As can be seen, there is a need for an improved method of bonding substrates, such as by anodic bonding. An additional need is for a flexible bonding method such that various substrates can be employed. Another need is for an anodic bonding method that minimizes the potential for damage to the substrates being bonded. There is also a need for minimizing the thickness of a dielectric layer in an anodic bonding method such that the required applied voltage can be minimized.

SUMMARY OF THE INVENTION

The present invention is directed to anodic bonding of substrates by the use of a sol-gel solution. Thereby, cumbersome steps needed in prior bonding techniques, such as masking, vacuuming and contraction matching are eliminated. Additionally, the present invention ameliorates the disadvantage in existing techniques that use glass plates or shims as a dielectric layer and, therefore, have a practical minimum thickness. With the present method, the thickness of the dielectric layer can be reduced to thereby reduce the required applied voltage. By lowering the applied voltage, the potential of damage to surface sensitive devices or small feature devices can be reduced.

More specifically, the present method includes the steps of forming a dielectric layer between the two substrates to be bonded, with the layer being formed from a sol-gel solution. The next step includes creating an ionic depletion region in the dielectric layer. That is accomplished through the application of a constant voltage across the substrates. Thereafter, a step includes heating the dielectric layer and substrates which produces metal oxide bonds between the dielectric layer and a substrate. In the present method, the sol-gel solution is such that the dielectric layer produced therefrom is optimized to allow for positive charge mobility in the layer and to provide good dielectric breakdown strength. Preferably, with a dielectric layer of about 100 A thick, the breakdown strength ranges from about $4.8 \times 10^6$ to about $1 \times 10^7$ V/cm. Such a breakdown strength can be accomplished with various sol-gel solutions, such as one derived from sodium aluminoborosilicate.

These and other features, aspects and advantages of the present invention will become better understood with reference to the following drawings, description, and claims.

BRIEF DESCRIPTION OF THE DRAWINGS

FIG. 1 diagrammatically depicts a method according to an embodiment of the present invention.

DESCRIPTION OF THE PREFERRED EMBODIMENTS

FIG. 1 depicts a method of anodic bonding of substrates using a sol-gel solution according to an embodiment of the present invention. A "sol" is a colloidal suspension of solid particles in a liquid. A "gel" is a colloidal suspension in which the particles of the colloid have become chemically bonded to such an extent that they have macroscopic dimensions and that a network of bonded molecules extends throughout the solution. In a "gel," it is possible to travel from one side of the solution to the other without leaving the solid phase. Likewise, it is possible to travel from one side of the solution to the other without leaving the liquid phase. A "xerogel" results when all of the solvent is dried from a gel. A "sol-gel" process includes metal organic precursors in solution which polymerize to form a gel.

The present invention generally includes the steps of providing a first substrate 10, a second substrate 11, and a dielectric layer 12 therebetween. The dielectric layer 12 is formed from a sol-gel solution which has been coated onto the second substrate 11. During the deposition of the sol-gel solution onto the substrate 11, hydrolysis and condensation of the solution produce an amorphous metal oxide film. The term "amorphous" is intended to mean an absence of measurable crystalline structure by X-ray diffraction. Residual solvent in the metal oxide film is removed through pyrolysis at a temperature which is less than that for densification of the film. The film can then be heated to a higher temperature to crystallize the film, if desired.

The processing steps continue by placing the substrate 11 having the densified film into an electrostatic bonder. The other substrate 10 is placed on the densified film such that the film or dielectric layer 12 is sandwiched between the substrates 10,11. A constant voltage from a power supply 13 is applied across the substrates 10,11 and the dielectric layer 12. That causes cations 14 in the dielectric layer 12 to move towards and accumulate at the interface of the layer 12 to the second substrate 11. With an absence of cations 14 and a presence of anions 15, an ionic depletion region 16 is formed in the layer 12 at its interface to the first substrate 10. In turn, the ionic depletion region 16 provides an anodic bonding region 18 where electrostatic bonds are formed between the first substrate 10 and the dielectric layer 12.

Next, the substrates 10, 11 and dielectric layer 12 are heated to form metal oxide bonds across the interface of the second substrate 11 and the dielectric layer 12. By virtue of such bonds, an oxygen depletion region 17 forms in the second substrate 11 at its interface to the dielectric layer 12. The result is that the second substrate 11 is chemically bonded to the dielectric layer 12 and the first substrate 10 is electrostatically bonded to the layer 12.

The substrates 10, 11 which can be bonded by using the present invention are varied. By way of example, the substrates 10, 11 can include ceramic, glass, metal and semiconductors. Generally, the substrates 10, 11 are of a sufficient or minimum conductivity to allow a voltage drop across the substrates 10, 11. For this embodiment of the invention, the first substrate 10 is electrostatically bonded to the dielectric layer 12. Accordingly, the substrate 10 should be of a conductivity sufficient to generate enough electrostatic forces at its interface with the dielectric layer 12 to create a bond at such interface. It is therefore preferred that the conductivity of the first substrate 10 be comparable to metals or semiconductors which have conductivities around the order of about $10^4$ to $10^6$ and $10^2$ to $10^6$ $ohm^{-1}$ $cm^{-1}$, respectively.

Thus, in the embodiment shown in FIG. 1, the first substrate 10 is relatively conducting when compared to the second substrate 11. Accordingly, the first substrate 10 may be referred to as a conducting substrate 10 and made of metal or semiconductor material. Similarly, the second substrate 11 may be referred to as an insulating substrate 11 and made of ceramic or glass. Nevertheless, the present invention contemplates that the substrates 10, 11 can be made of identical materials.

Onto at least one of the substrates 10, 11 is deposited a sol-gel solution. In this preferred embodiment, the sol-gel solution need only be applied to one of the two substrates 10, 11, since the other substrate will be subject to anodic bonding to the processed sol-gel solution. For the embodiment shown in FIG. 1, the sol-gel solution is deposited onto the second substrate 11.

The deposition of the sol-gel solution onto to the substrate 11 can be accomplished by well known methods such as spraying and spinning. The technique of spinning is preferred in this embodiment because of the ease of application and the relatively thin, even layer that can be produced. Various commercially available equipment can be used for spin coating the substrate 11, such as a Headway photoresist spinner.

The particular amount of sol-gel solution deposited onto the substrate 11 can vary with the thickness of the dielectric layer 12 desired. The preferred thickness of the dielectric layer 12 can theoretically approach the size of a single sol-gel molecule or that which is minimally necessary to form a network of metal oxide bonds described below. That preferred thickness is due, in part, to the fact that as the thickness of the dielectric layer 12 decreases, the required applied voltage in the bonding process decreases. And lower applied voltages are desired to lower the potential of damage to the substrates 10, 11. In this embodiment, a preferred thickness for the dielectric layer 12 is about 100–1000 Å, particularly when the applied voltage is not more than about 10 V. Still, if one or both of the substrate 10,11, for example, are bowed or have an uneven surface topology, a thicker dielectric layer 12 will be needed to fill the voids between the substrates 10, 11.

The sol-gel solution deposited onto the substrate 11 is preferably formed with at least one metal organic precursor and an organic solvent. The metal organic precursor and solvent can be one of a variety of compounds further described below. Generally, the sol-gel solution is characterized by its ability to form the dielectric layer 12 which preferably provides sufficient dielectric breakdown strength to resist relatively higher applied voltages at a given thickness. Again, in the circumstance of a layer about 100–1000 Å thick, and an applied voltage that does not exceed about 10 V, the layer 12 will have a minimum breakdown strength of about $4.8–5.0 \times 10^6$ V/cm and a maximum of about $1 \times 10^7$ V/cm for this embodiment. Outside of such range, the dielectric layer 12 will tend to short due to dielectric failure and will not set up the charge depletion layers required for anodic bonding. Glasses do not tend to exceed dielectric strengths of about $1 \times 10^7$ V/cm due to the nature of the bonding and density. The layer 12 also provides relatively weak ionic conduction (i.e., some conduction but still acts as dielectric) to allow for positive charge mobility, as further described below.

Various solvents can be used to form the sol-gel solution. The selected solvent should be chemically compatible with the metal organic precursor and have the ability to evaporate at a sufficiently high rate to form a film or coating over the second substrate 11, but at a low enough rate to maintain uniformity of the film or coating. Some examples of solvents that can be used in practicing the present invention include ethanol, butanol, isopropanol, 2-methoxyethanol, pentanol, hexanol, and 2-methoxy-1-propanol. Because of its ease of pyrolysis and lack of toxicity, ethanol is the preferred solvent for this embodiment.

In this embodiment of the invention, the metal organic precursor includes at least one metal and an organic ligand. The metal is used as an ion for ionic conduction in the anodic bonding process. A wide range of ions can be used in practicing this invention, since the ions are only required to have some mobility (i.e., conductivity) in the dielectric layer 12. But from a practical view, a lower mobility means a longer time for anodic bonding to occur. Therefore, higher ion mobility will translate to lower processing time.

Accordingly, monovalent ions and divalent ions are contemplated for practicing the present invention, although the former are preferred because of their relatively higher conductivities. Some examples of divalent ions include magnesium, calcium, strontium, and barium. Examples of monovalent ions include sodium, potassium, lithium, and rubidium. Of those monovalent ions, sodium is preferred because of its higher mobility in comparison to the other ions. The sodium used in the dielectric layer 12 for this embodiment of the invention has a conductivity at about 200 degrees C of about $1 \times 10^{-13}$ $ohm^{-1}$ $cm^{-1}$, which is about a preferred minimum conductivity for the conducting ion. Below such conductivity, the time to create a sufficient charge for bonding becomes too high from a practical view. A preferred maximum conductivity at about 200 degrees C for the metal used in the dielectric layer 12 is about $1 \times 10^{-1}$ $ohm^{-1}$ $cm^{-1}$ such as for $Na^+$ in β-alumina. Above such conductivity, the dielectric layer 12 tends to become too much of a conductor, which means that no charge depletion layers can be established for anodic bonding.

Although the present invention can be practiced by using a single metal organic precursor, it is also contemplated that a mixture of metal organic precursors can be used. As is known, multiple metal organic precursors can lower the processing temperature relative to the melt or sinter processed component because thermally activated diffusion is not required for atomic mixing. For example, mixtures of sodium, boron, silicon, zinc, aluminum and potassium can be used in practicing this invention. The combination of sodium, boron, silicon and aluminum are preferred for this embodiment of the invention due to their ability to easily form ionically conducting glasses with high dielectric breakdown strengths.

The selected metals are formed into metal organic precursors by combining them with respective organic ligands. Those ligands can vary and are dependent upon the formed metal-ligand being soluble in one of many solvents described below. For example, useful ligands include acetate, methoxyethoxide, methoxide, butoxide, isopropoxide, ethoxide and hydroxide ions. Double alkoxides in which, for example, sodium is prelinked to a boron or aluminum alkoxide may also be used. Relatively complex, long chain anion salts are generally not preferred because they tend to be not easily eliminated from solution by ester elimination in the sol-gel process or by subsequent pyrolysis. With sodium being used in this embodiment as the preferred metal for conduction in the dielectric layer 12, it is preferred that acetate be used as the ligand because of its utility in the pH ranges and water concentrations required for making a stable sol-gel solution suitable for film casting and spinning in this invention. For silicon and aluminum, the preferred ligands are a double alkoxide, an ethoxide and a butoxide. For boron, the preferred ligand is an ethoxide.

With sodium being the preferred conducting metal in the dielectric layer 12, and its preferred ligand being acetate, a sodium aluminoborosilicate composition similar to Pyrex® glass (80.5 $SiO_2$·12.9 $B_2O_3$·4.2 $Na_2O$·2.2 $Al_2O_3$) can be made. Such composition is preferred because of the known high dielectric breakdown strength and mobile sodium ions in Pyrex® glass. In the preferred embodiment of the sodium aluminoborosilicate composition, the molar ratios are about 75–90% $SiO_2$, 5–20% $B_2O_3$, 1–10% $Na_2O$ and 0–5% $Al_2O_3$.

Preparation of the sodium aluminoborosilicate composition is carried out in a glove box to prevent excess moisture from reacting with the metal organic precursors. An aluminoborosilicate solution is prepared with tetraethylorthosilicate (TEOS) slowly mixed into a solution of anhydrous ethanol, de-ionized water for hydrolysis and hydrochloric acid for a catalyst. The volume dilution of TEOS to ethanol is about 1:0.5–5. More preferably, the volume dilution is about 1:1 TEOS to ethanol. Useful molar ratios are about 1:1–2 TEOS to water and $1:1 \times 10^{-5}$–$1 \times 10^{-2}$ TEOS to hydrochloric acid, and preferably about 1:1 TEOS to water and $1:7.3 \times 10^{-4}$ TEOS to hydrochloric acid. The resulting TEOS solution is mixed for about 30 minutes to 4 hours, and preferably about 1 hour.

Next, aluminosilicate double alkoxide ($[(C_2H_5O)_2SiO]$ $[(C_4H_9O)_2AlO]$) is slowly added to the stirring TEOS solution followed by the addition of a solution containing anhydrous ethanol and de-ionized water. A useful molar ratio of TEOS to the aluminosilicate double alkoxide is about 20:1, and preferably about 17:1. Generally, the molar ratios of aluminosilicate double alkoxide to ethanol and water are adjusted such that the ending molarity of the sol-gel solution is about 0.2 to 1.0 M, as described below. Furthermore, the molar ratio of aluminosilicate double alkoxide to all water added in the process preferably does not exceed about 1:3. Thus, the molar ratio of the aluminosilicate double alkoxide to ethanol is about 1:185, while the molar ratio of the aluminosilicate double alkoxide to water is about 1.1:1.

To the aluminosilicate double alkoxide solution, triethylborate ($B(OCH_2CH_3)_3$) and ethanol in a molar ratio of about 1:45 are added and stirred for about 15 minutes to 4 hours, and preferably about 30 minutes. A useful molar ratio of TEOS to triethylborate is about 2.5:1 and preferably about 3:1.

For the final sodium aluminoborosilicate composition, a sodium precursor is also prepared by dissolving sodium acetate ($Na(OCH_2CH_3)$) in a solution of de-ionized water and glacial acetic acid ($CH_3CO_2H$). The molar ratio of sodium acetate to acetic acid is not more than about 0.6:1 and preferably about 0.36:1. The amount of water and acetic acid is again adjusted based upon the final molarity of the stock solution. Therefore, the molar ratio for sodium acetate to water at this point in the process is not more than about 0.15:1, and preferably about 0.12:1.

Dropwise amounts of the sodium precursor are then added to the stirring aluminoborosilicate solution. The entire solution is stirred for about 15 minutes to 20 hours, and preferably about 30 minutes. The stock solution produced from the steps described above provides a molar concentration from about 0.2 to 1.0 M. If the concentration is above such range, then the solution becomes difficult to spin or spray into a film. And below such range, uniform substrate coverage becomes difficult. Preferably, the molar concentration is about 0.75 M because of film processing ease. To produce the final sol-gel solution, the solution is diluted with dried butanol in a ratio from about 0–1:1 stock solution to butanol, although the preferred ratio is about 1:1.

For deposition onto the substrate 11, an amount of the sol-gel solution can be placed onto the cleaned substrate 11 and then spun using a Headway photoresist spinner. In part, the amount deposited on the substrate 11 need not be tightly controlled since excess solution can be spun off. The spinner can be modified with an alcohol rinse in its bowl which prevents gel particulate formation on the apparatus and contamination of the substrate 11. The substrate 11 is spun at about 1000–7000 rpm over about 10–60 seconds, although it is preferred at about 2000 rpm for about 30 seconds. The spinning process allows the sol-gel solution to undergo hydrolysis and condensation to produce an amorphous metal oxide film on the substrate 11.

The coated substrate 11 is then pyrolyzed for about 1 to 5 minutes at about 250 to 350 degrees C to remove residual organics. It is preferred that pyrolysis occur for about 3–5 minutes at about 300 degrees C. Optionally, multiple coatings or layers of the sol-gel solution can be applied by cyclically coating the substrate 11 and pyrolyzing each coating. Multiple coatings are desirable, for example, to tailor coating thickness and to cover individual layer defects. With four coatings, for example, pyrolysis preferably occurs at about 300 degrees C for 5 minutes. The single or multiple sol-gel coating(s) is then densified at about 600 to 1000 degrees C for about 15 minutes to 2 hours to provide the dielectric layer 12. With four coatings, densification preferably occurs at about 700 degrees C for about 30 minutes.

The densified, coated second substrate 11 is placed in any commercially available anodic bonder, such as an Electronic Vision bonder. Within the bonder, the first substrate 10 is then juxtaposed to the dielectric layer 12, as shown in FIG. 1. Anodic bonding of the first substrate 10 to the dielectric layer 12 can occur at 10 mv to 10 V, 0 to 4 bars, 200 to 600 degrees C, and for 10 seconds to 30 minutes. The preferred conditions for this embodiment are not more than about 10 V, 2800 mbars, 450 degrees C, and for 5 minutes. With the heating during such step, the metal oxide film forms oxide bonds with the substrate 11.

EXAMPLE

All solvent chemistry was performed in a glove box filled with a dry nitrogen atmosphere and a relative humidity therein of not more than about 20%. An aluminoborosilicate solution was prepared with 28.4 ml of TEOS (0.13 moles) slowly mixed into a solution containing 28.4 ml anhydrous ethanol (1:1 volume dilution of TEOS), 2.42 ml of de-ionized water (1 mole water/mole TEOS) and 98 $\mu$l of hydrochloric acid ($7\times10^{-4}$ mole HCl/mole TEOS). The TEOS solution was mixed for 1 hour.

Next, 2.58 ml ($7.32\times10^{-2}$ moles) of 1:1 aluminosilicate double alkoxide was slowly added to the stirring TEOS solution followed by the addition of a solution containing 80 ml anhydrous ethanol and 122 $\mu$l of deionized water. To such solution was added 7.4 ml of triethylborate ($4.30\times10^{-2}$ moles) and 112 ml of ethanol and then stirred for 30 minutes.

A sodium precursor was prepared by dissolving 1.16 g of sodium acetate (0.014 moles) in a solution of 2.4 ml of de-ionized water and 2.24 ml of glacial acetic acid (0.01 moles). The final solution was achieved by adding dropwise amounts of the sodium precursor to the stirring aluminoborosilicate solution. The entire solution was stirred for 30 minutes and provided a final molarity of about 0.75 M. After stirring, the stock solution was diluted 1:1 with dehydrated butanol.

2–3 ml of the diluted stock solution was dispensed over a cleaned silicon wafer and then spun at 2000 rpm for 30 seconds using a Headway photoresist spinner modified with an alcohol rinse in its bowl. Preferably, the substrate 11 is spun at about 2000 rpm for about 30 seconds. Four coatings were spun on with each layer pyrolyzed at 300 degrees C. The four coatings provided a combined thickness of about 1000 Å. Thereafter, the wafer was densified at 700 degrees C for 30 minutes.

The coated wafer was then bonded to a second silicon wafer in an Electronic Vision bonder. Bonding was accomplished at not more than about 10 V, 2800 mbars, 450 degrees C, and for 5 minutes. IR photography indicated as much as 90% of the wafer surface bonded.

It should be understood, of course, that the foregoing relates to preferred embodiments of the invention and that modifications may be made without departing from the spirit and scope of the invention as set forth in the following claims.

What is claimed is:

1. A method of bonding two substrates together, comprising the steps of:
    coating at least one of said substrates with a solution such that a coating is formed;
    producing a metal oxide film from said coating on at least one of said substrates;
    densifying said metal oxide film to produce a dielectric layer having a thickness of about 100 to 1000 Å; and
    applying a voltage of not more than about 10 V across at least one of said substrates.

2. The method of claim 1, wherein said solution comprises a metal organic precursor and a solvent.

3. The method of claim 1, further comprising the step of heating said metal oxide film such that oxide bonds are formed between said film and at least one of said substrates.

4. The method of claim 1, further comprising the step of heating said metal oxide film such that a solvent is substantially removed from said film.

5. The method of claim 1, further comprising the step of cyclically coating at least one of said substrates with said solution such that a plurality of coatings are formed.

6. The method of claim 1, wherein the step of applying a voltage comprises the step of creating an ionic depletion region in said metal oxide film.

7. A method of bonding two electrically conductive substrates together, comprising the steps of:
    forming a dielectric layer between said substrates, said layer being formed from a sol-gel solution and having a thickness of about 100 to 1000 Å;
    applying a voltage of not more than about 10 V across said dielectric layer and substrates;
    creating an ionic depletion region in said dielectric layer; and
    heating said dielectric layer and substrates after the step of creating said ionic depletion region such that an oxygen depletion region is created in one of said substrates.

8. The method of claim 7, further comprising the step of juxtaposing said dielectric layer and substrates to one another.

9. The method of claim 7, wherein said dielectric layer is characterized by a breakdown strength of about $4.8\times10^6$ to $1.0\times10^7$ V/cm.

10. The method of claim 7, wherein said dielectric layer comprises an ion selected from the group consisting of a monovalent ion and a divalent ion.

11. The method of claim 10, wherein said monovalent ion is selected from the group consisting of sodium, potassium, lithium and rubidium.

12. The method of claim 10, wherein said divalent ion is selected from the group consisting of magnesium, calcium, strontium and barium.

13. The method of claim 7, wherein said sol-gel solution comprises a metal organic precursor.

14. The method of claim 13, wherein said metal organic precursor comprises an organic ligand selected from the group consisting of methoxide, ethoxide, propoxide, butoxide, citrate, nitrate, alkoxide and hydroxide ions.

15. A method of bonding first and second substrates together, comprising the steps of:

depositing a sol-gel solution on said second substrate;

densifying said sol-gel solution to produce a dielectric layer, the step of densifying occurring after the step of depositing;

juxtaposing said second substrate to said first substrate;

applying a voltage across said first substrate at not more than about 10 V; and heating said dielectric layer and substrates after the step of applying a voltage.

16. The method of claim 15, wherein the step of depositing occurs by spin-coating said sol-gel solution onto said second substrate.

17. The method of claim 15, wherein said sol-gel solution comprises an organic ligand selected from the group consisting of methoxide, ethoxide, propoxide, butoxide, citrate, nitrate, alkoxide and hydroxide ions.

18. The method of claim 15, wherein said sol-gel solution comprises a metal selected from the group consisting of sodium, potassium, lithium, rubidium, magnesium, calcium, strontium and barium.

19. The method of claim 15, wherein said sol-gel solution comprises sodium aluminoborosilicate.

20. The method of claim 19, wherein said sodium aluminoborosilicate comprises about 75–90 mol % $SiO_2$, about 5–20 mol % $B_2O_3$, about 1–10 mol % $Na_2O$ and about 0–5 mol % $Al_2O_3$.

21. The method of claim 15, wherein the step of applying a voltage occurs at about 2800 mbars, 450 degrees C, and 5 minutes.

22. The method of claim 15, wherein said dielectric layer is not more than about 100 Å thick.

23. The method of claim 19, wherein said dielectric layer is characterized by a breakdown strength of about $5 \times 10^6$ V/cm.

* * * * *